United States Patent [19]

Auroux

[11] Patent Number: 6,026,310

[45] Date of Patent: Feb. 15, 2000

[54] METHOD OF REDUCING CLICKS IN A DATA TRANSMISSION SYSTEM

[75] Inventor: Elisabeth Auroux, Rouen, France

[73] Assignee: U.S. Philips Corporation, New York, N.Y.

[21] Appl. No.: 09/008,340

[22] Filed: Jan. 16, 1998

[30] Foreign Application Priority Data

Jan. 21, 1997 [FR] France ................... 97 00581

[51] Int. Cl.[7] ................ H04B 1/38; H04B 17/00; H04B 1/10

[52] U.S. Cl. ................ 455/570; 455/67.3; 455/67.1; 455/296; 704/210; 375/346; 370/528; 370/433; 381/94.1; 381/94.5

[58] Field of Search ................... 455/570, 462, 455/403, 422, 67.1, 67.3, 465, 423, 425, 226.1, 501, 63, 296; 704/210, 219, 226, 214, 208; 370/528, 433, 493, 427, 428, 522; 381/94.1, 94.5; 375/346

[56] References Cited

U.S. PATENT DOCUMENTS

| | | | |
|---|---|---|---|
| 4,142,066 | 2/1979 | Ahamed | 704/233 |
| 4,449,190 | 5/1984 | Flanagan et al. | 704/215 |
| 5,533,133 | 7/1996 | Lamkin et al. | 381/94 |
| 5,732,356 | 3/1998 | Bolt | 455/462 |
| 5,842,123 | 11/1998 | Hamamoto et al. | 455/412 |
| 5,897,613 | 4/1999 | Chan | 704/210 |

FOREIGN PATENT DOCUMENTS

WO9429851  12/1994  WIPO ............... G10L 9/18

*Primary Examiner*—Dwayne D. Bost
*Assistant Examiner*—Tracy M. Legree
*Attorney, Agent, or Firm*—Dicran Halajian

[57] ABSTRACT

A method for diminishing the effect of transmission errors in samples produced on the output of a decoder in a data transmission system, wherein the samples are attenuated when transmission errors are detected during various successive frames. The invention makes it possible to take isolated transmission errors into account when they are situated in a silence, that is, when they are particularly annoying to the user.

9 Claims, 3 Drawing Sheets

6,026,310

METHOD OF REDUCING CLICKS IN A DATA TRANSMISSION SYSTEM

FIELD OF THE INVENTION

The present invention relates to a transmission system for transmitting digitally coded data between at least a transmitter and a receiver, said receiver itself comprising decoding means which produce samples, and sample processing means for reducing the effect of transmission errors on said samples.

The invention likewise relates to a method of reducing the effect of transmission errors on samples produced on the output of decoding means of a transmission system for transmitting digitally coded data, said method comprising a sample processing step.

The invention finally relates to a wireless telephone comprising a base and a handset including each transceiver means for exchanging digitally coded data, said receiving means themselves comprising decoding means which produce samples, and sample processing means for reducing the effect of transmission errors on said samples.

BACKGROUND OF THE INVENTION

The invention has interesting applications, notably in the field of wireless telephony where the invention makes it possible to improve significantly the listening comfort for the user.

International patent application no. 94/29851 relates to a speech transmission system by radio channel in the form of frames and describes various methods of diminishing the effect transmission errors have on the samples produced on the output of the decoder. One of these methods notably consists of totally attenuating the samples produced on the output of the decoder when transmission errors are detected during various successive frames.

However, such a method does not permit of taking into account the isolated transmission errors which appear with a relatively high probability notably when there is a transmission between a base and a handset of a wireless telephone.

SUMMARY OF THE INVENTION

The invention notably has for its object to propose a method, independently applicable or complementary to this known method, which permits of remedying this convenient effect.

Therefore, a transmission system according to the invention and as described in the opening paragraph is characterized in that said receiver comprises:

detection means for detecting silence in said data, detection means for detecting in said silence parasitic samples caused by said transmission errors, activating means for activating said processing means for at least certain of said parasitic samples.

Similarly, a method according to the invention and as described in the opening paragraph, of reducing the effect of transmission errors is characterized in that it comprises:

a detection step for detecting silence in said data, a detection step for detecting in said silence parasitic samples caused by said transmission errors, and in that the invention consists of applying said processing step to at least certain of said parasitic samples.

Finally, a telephone according to the invention and as described in the opening paragraph is characterized in that said receiving means comprise:

detection means for detecting silence in said data, detection means for detecting in said silence parasitic samples caused by said transmission errors, activating means for activating said processing means for at least certain of said parasitic samples.

The invention thus provides the advantage of attenuating the parasitic samples caused by the transmission errors, even isolated ones, when they are situated in silence, that is to say, when they are particularly annoying to the user.

In a particularly advantageous embodiment of the present invention, said detection means for detecting parasitic samples comprise comparing means for comparing the amplitude of the samples with a reference value, computed over various preceding samples, and higher than a minimum value.

In this embodiment, a sample having an amplitude peak which is lower than a minimum value is not detected as a parasitic sample, even if it follows a plurality of samples whose amplitude was practically zero.

In another embodiment of the invention, said samples are transmitted in frames, and a frame is detected as being a silence frame when the amplitudes of its samples taken individually or on average are compared with a predetermined threshold. Advantageously, means are provided for distinguishing in said silence frames, frames called intersyllabic silence frames from frames called established silence frames, and said activating means permit of processing each parasitic sample of an established silence frame, and a plurality of samples following each of said parasitic samples.

The fact that several samples are processed after the parasitic sample is particularly advantageous when the coding which is carried out at transmitter level prior to the transmission is a differential coding. In that case, in order to avoid the attenuation of the speech samples, one advantageously chooses not to process the intersyllabic silence.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figures 1, 3, 4:
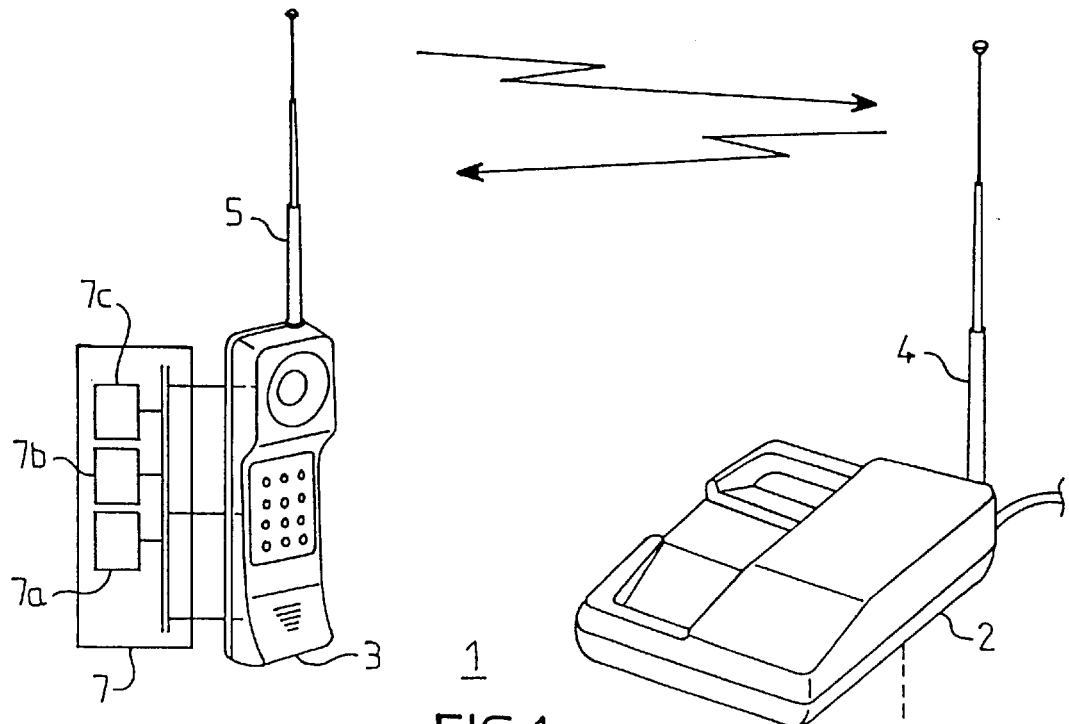
FIG. 1 represents an example of a transmission system according to the invention.
FIGS. 2 to 4 represent examples of an operation flow chart of a sample processing method according to the invention, FIG. 5A and FIG. 5B gives an example of the results obtained thanks to the invention with a silence signal, and FIG. 6A

In FIG. 1 is shown by way of example a transmission system according to the invention which is formed by a wireless telephone 1. This wireless telephone comprises a base 2 and a handset 3 having an antenna 4 and 5 respectively, and transceiver means for exchanging data (notably speech data) by radio channel.

In the following, the telephone described by way of example is a telephone according to the DECT standard defined by ETSI (reference ETS 300 175). Said transceiver means of the base and handset thus comprise speech coding/decoding means of the ADPCM type (Adapted Differential Pulse Code Modulation) defined in Recommendation G.721 of the CCITR.

Said transceiver means, said coding/decoding means and the means according to the invention which will be described hereinafter are advantageously used in the form of software in a set of microprocessors 6 and 7, respectively. These sets of microprocessors are formed, for example, for the handset and for the base by the circuits PCD 5091F3/31 and PCD 5092F3/41 respectively, manufactured by Philips Semiconductors. They comprise an actual microprocessor 6a and 7a respectively, a random-access memory 6b and 7b and a read-only memory 6c and 7c in which are notably stored instructions which are necessary for the operation of said transceiver and coding/decoding means.

A poor quality of the radio link between the base and the handset is likely to cause errors in the transmitted binary elements, which calls forth the appearance of parasitic samples (currently called "clicks") on the output of the decoding means, thus creating an annoyance which is all the more significant if the parasitic samples occur in periods of silence.

The invention notably comprises influencing the samples produced by said decoding means so as to process the parasitic samples which are situated in periods of silence and whose amplitude exceeds a predetermined value. In a first variant of an embodiment of the invention this processing consists of attenuating said samples. In another variant it consists of substituting a mean value MOY computed on the basis of the received samples for the parasitic samples.

In the following of the description a particularly advantageous embodiment of the invention is described with reference to FIGS. 2, 3 and 4, which embodiment corresponds to the division per frame used in the DECT standard.

Figure 2:
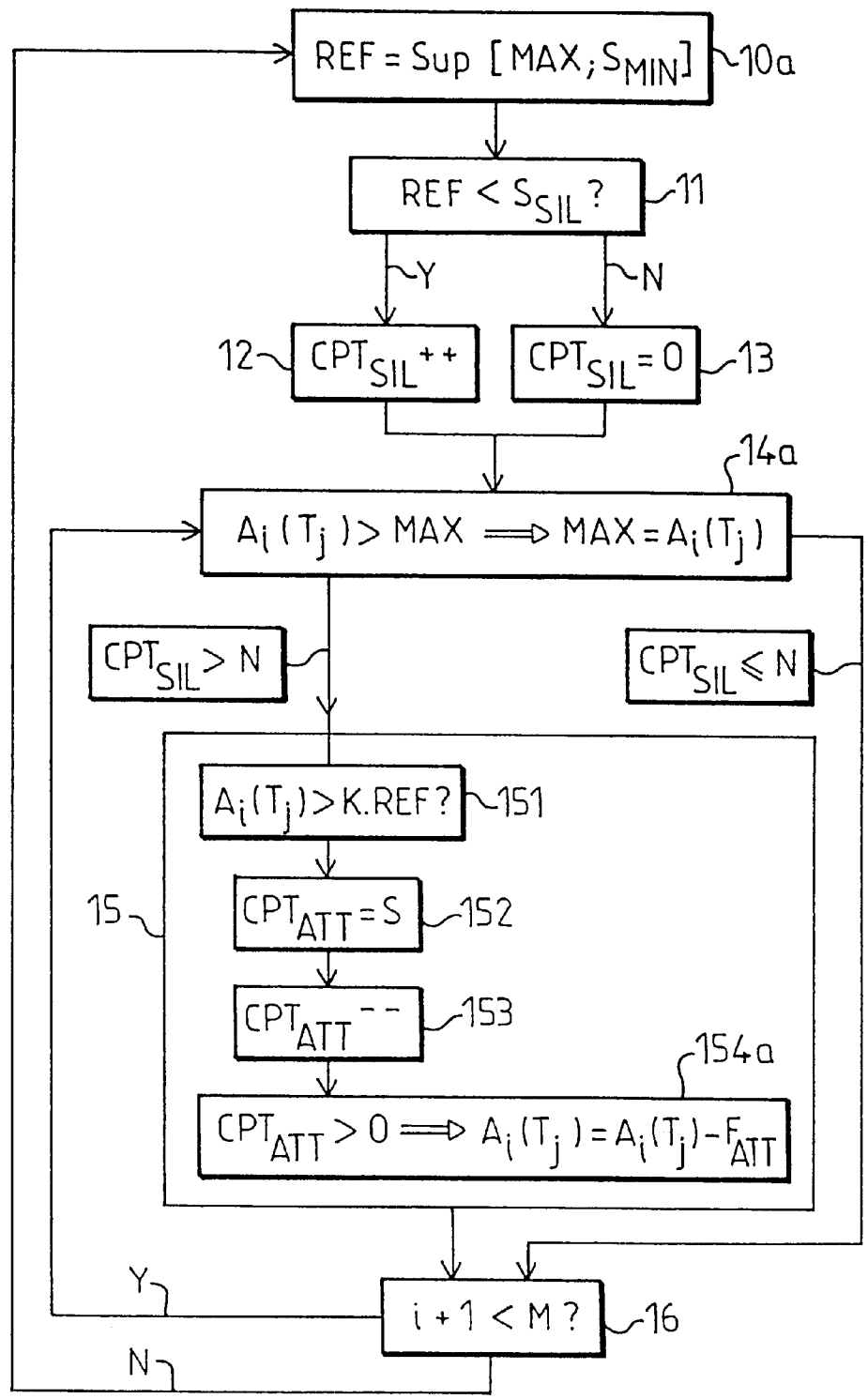

At the start of each frame $T_j$, the method returns to box 10a or box 10b of the flow charts of FIGS. 2 and 3 for defining a value REF which represents the level of the samples of the preceding frame $T_{j-1}$. According to a first variant shown in FIG. 2 in box 10a, this value REF is equal to:

the maximum MAX of the amplitudes $A_i(T_{j-1})$ of the samples of the preceding frame if this maximum is higher than a minimum value $S_{MIN}$, and the minimum value $S_{min}$ if not. According to a second variant represented in FIG. 3 in box 10b, the value REF is equal to:

a mean value $\overline{A_i(T_{j-1})}$ of the amplitudes $A_i(T_{j-1})$ of the samples of the preceding frame if this mean value is higher than a minimum value $S_{MIN}$, and the minimum value $S_{MIN}$ if not.

The method is then proceeded to box 11. In box 11 is determined whether the preceding frame $T_{j-1}$ is a silence frame by comparing the value REF computed in boxes 10a or 10b with a silence threshold denoted $S_{SIL}$. If REF<$S_{SIL}$, the frame $T_{j-1}$ is a silence frame and, in box 12, a counter of silence frames denoted $CPT_{SIL}$ is incremented by unity. If not, the frame $T_{j-1}$ is not a silence frame and, in box 13, the counter $CPT_{SIL}$ is reset to zero. As will be seen hereinafter, it is the counter $CPT_{SIL}$ that will permit of distinguishing the established silence from the intersyllabic silence as one only considers a frame to be an established silence frame after N successive silence frames have been received.

For each received sample i, the data relating to the current frame $T_j$ which data will be used for the next frame $T_{j+1}$ will then be updated.

Therefore, and according to the first variant of the embodiment of the invention shown in FIG. 2 in box 14a, the value of the amplitude $A_i(T_j)$ of the sample i is compared to that of a variable MAX which contains the maximum amplitude already received for the current frame $T_j$. And if $A_i(T_j)$>MAX, the value $A_i(T_i)$ is assigned to the variable MAX.

And, according to the second variant of the invention shown in FIG. 3 in box 14b, the amplitude $A_i(T_j)$ of the sample i is computed and when i=M-1, a mean value $\overline{A_i(T_j)}$ is computed with the M computed values for the frame j.

The operation is then carried on in box 15 if the value of the silence counter $CPT_{SIL}$ exceeds the value N. If not, box 16 is directly proceeded to.

In box 15 the following operations are carried out for each sample i received in the current frame $T_j$:

box 151: the amplitude $A_i(T_j)$ of the received sample is compared in an absolute value with the reference value REF itself multiplied by a factor K.

If $|A_i(T_j)|$>K.REF, the sample i and the S samples thereafter are attenuated. Therefore, in box 152 an attenuation counter $CPT_{ATT}$ is initialized at the value S. Thereafter, in box 153, this counter is decremented by unity.

In box 154a and in box 154b of the flow charts of FIGS. 2 and 4, there is tested whether the value of the counter $CPT_{ATT}$ is positive. If that is the case, according to a first variant represented in box 154a, the sample i is attenuated by a factor $F_{ATT}$. And, according to a second variant shown in box 154b, the sample i is replaced by a mean value MOY which is, for example, equal to a mean value of the amplitudes $A_i(T_{j-1})$ of the samples of the preceding frame $T_{j-1}$.

S In box 16, the value of the index i is tested. As long as i+1<M, where M is the number of samples per frame, the operation is resumed at box 14 for the next sample i+1 of the frame $T_j$. When i+1=M, the frame $T_j$ has been processed completely, the index i is re-initialized at the zero value and the operation is resumed at box 10.

In this embodiment, all the samples of an established silence frame are thus attenuated whose amplitude exceeds a given threshold as are the (S-1) next samples. Once a parasitic sample has been detected in an established silence frame, the attenuation is thus applied to at least S samples and to more than S+M samples. Beyond the S+M samples, the passing of N new silence frames is to be waited for before it is possible to attenuate the parasitic samples again.

In practice, for example the following values are chosen:
$S_{MIN}$=–48 dB
$S_{SIL}$=–30 dB
N=5: the duration of the DECT frame being 10 ms, a value of N=5 thus corresponds to a very brief period during which the parasitic samples are not attenuated. This measure thus reduces in certain cases the effectiveness of the method according to the invention, but it permits of guaranteeing that more than [(S+M)/M]. 10 ms of speech will be lost if parasitic samples are detected erroneously.

K=16, which means that, for being attenuated, the amplitude of a sample is to exceed sixteen times the maximum amplitude read in the preceding frame, $F_{ATT}$=18 dB, and S=160, that is to say, 2 DECT frames because one DECT frame contains 80 samples.

Figure 5A:
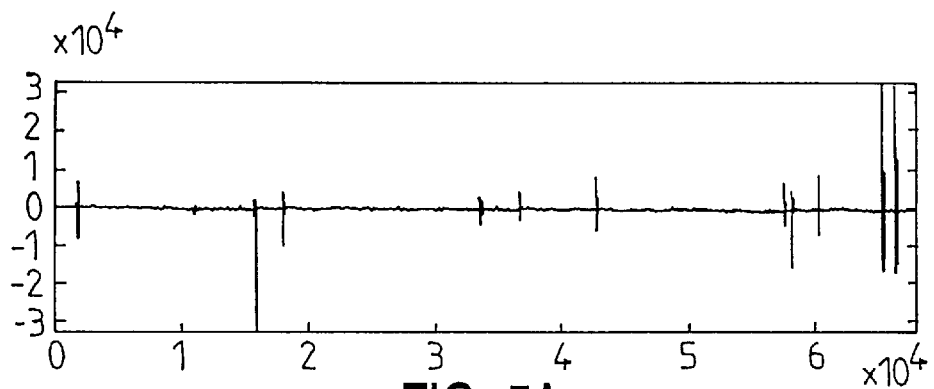
Figure 5B:
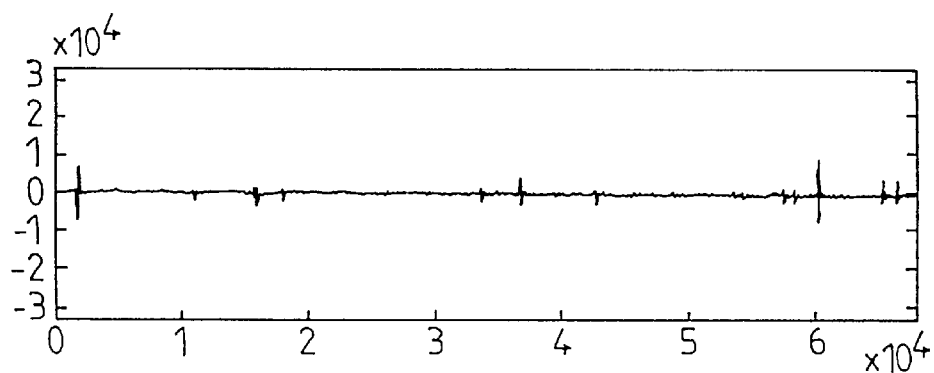

In the FIGS. 5 and 6 are shown by way of example results obtained when these values are utilized. The rank of the samples in these figures is indicated on the x-axis and their amplitude is indicated on the y-axis (such amplitude is coded with 16 bits and, consequently, takes values between –32768 and +32767). The FIG. 5a represents a silence signal with errors. FIG. 5b represents the same silence signal after attenuation of the parasitic samples according to the method that has just been described: the greater part of the parasitic samples is attenuated well.

Figure 6A:
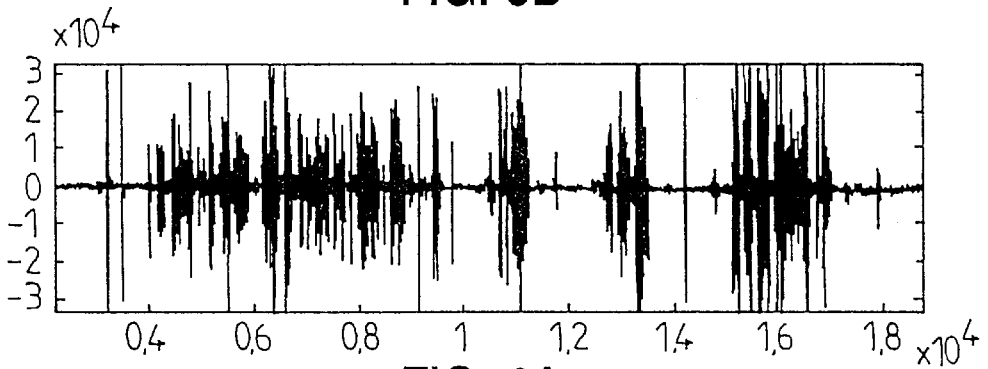
FIG. 6B shows an example of the results obtained after a method according to the invention is applied to a speech signal.
Figure 6B:
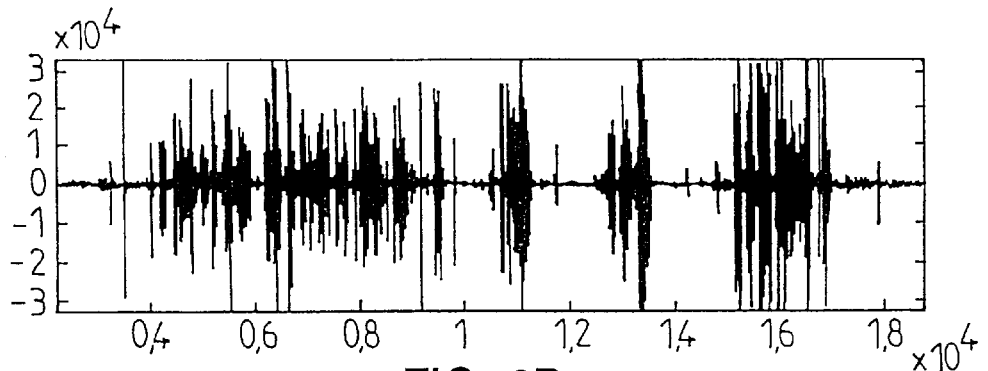

FIG. 6a represents a speech signal containing errors, and FIG. 6b represents the same signal after the implementation of the method according to the invention: it is found that the speech signal is not altered by the implementation of this method.

It will be obvious that the invention is not restricted to the embodiment that has just been described by way of example.

More particularly, the invention is applied in a particularly advantageous manner to all the wireless telephony systems which make use of a coding of the ADPCM type. Indeed, the frequency of the parasitic samples introduced on the output of an ADPCM decoder (which is typically situated around 1000 Hz to 1200 Hz) belongs to the frequency band of the payload signal (up to 3800 Hz for speech). In this case it is thus impossible for a conventional filter method to detect the payload signal from the clicks, and the invention provides a particularly simple and effective solution to this problem.

On the other hand, it is possible to utilize several variants of the embodiments that have just been described by way of example: for example, one may apply other criterions for detecting silence, and the presence of parasitic samples in this silence.

I claim:

1. A transmission system for transmitting digitally coded data between at least a transmitter and a receiver, said receiver itself comprising decoding means which produce samples, and sample processing means for reducing the effect of transmission errors on said samples, characterized in that said receiver comprises:

detection means for detecting silence in said digitally coded data, detection means for detecting in said silence, parasitic samples caused by said transmission errors, activating means for activating said sample processing means for at least certain of said parasitic samples.

2. The transmission system as claimed in claim 1, characterized in that said detection means for detecting parasitic samples comprise comparing means for comparing the amplitude of the samples to a reference value, computed over various preceding samples and higher than a minimum value.

3. A transmission system as claimed in claim 1, in which said samples are transmitted in frames, characterized in that a frame is detected as being a silence frame when the amplitudes of its samples, taken individually or on average are compared with a predetermined threshold.

4. The transmission system as claimed in claim 3, characterized in that said activating means permits the processing of each parasitic sample of a silence frame.

5. The transmission system as claimed in claim 3, characterized in that it comprises distinguishing means for distinguishing intersyllabic silence frames from established silence frames in said silence frames, and in that said activating means permits the processing of each parasitic sample of an established silence frame.

6. The transmission system as claimed in claim 5, characterized in that said activating means permits the processing of a plurality of samples which follow said parasitic samples of an established silence frame.

7. A method of reducing the effect of transmission errors on samples produced on an output of a decoding means of a transmission system for transmitting digitally coded data, said method comprising a sample processing step, characterized in that it comprises:

a detection step for detecting silence in said digitally coded data, a detection step for detecting in said silence parasitic samples caused by said transmission errors, and in that the method comprises of applying said sample processing step to at least certain of said parasitic samples.

8. A wireless telephone comprising a base and a handset including each transceiver means for exchanging digitally coded data, said receiving means themselves comprising decoding means which produce samples, and sample processing means for reducing the effect of transmission errors on said samples, characterized in that said receiving means comprise:

detection means for detecting silence in digitally coded data, detection means for detecting in said silence, parasitic samples caused by said transmission errors, activating means for activating said sample processing means for at least certain of said parasitic samples.

9. The wireless telephone as claimed in claim 8, characterized in that it is in conformity with the DECT standard.

* * * * *